(12) United States Patent
Wilson et al.

(10) Patent No.: US 7,601,556 B2
(45) Date of Patent: Oct. 13, 2009

(54) FRONT SIDE ELECTRICAL CONTACT FOR PHOTODETECTOR ARRAY AND METHOD OF MAKING SAME

(75) Inventors: Robin Wilson, Belfast (GB); Conor Brogan, Belfast (GB); Hugh J. Griffin, Newtownabbery (GB); Cormac MacNamara, Belfast (GB)

(73) Assignee: Icemos Technology Ltd., Belfast, Northern Ireland (GB)

( * ) Notice: Subject to any disclaimer, the term of this patent is extended or adjusted under 35 U.S.C. 154(b) by 0 days.

(21) Appl. No.: 12/116,638

(22) Filed: May 7, 2008

(65) Prior Publication Data

US 2008/0248608 A1    Oct. 9, 2008

Related U.S. Application Data

(62) Division of application No. 11/681,543, filed on Mar. 2, 2007, now Pat. No. 7,489,014.

(60) Provisional application No. 60/778,481, filed on Mar. 2, 2006.

(51) Int. Cl.
*H01L 21/00* (2006.01)
(52) U.S. Cl. .................. 438/57; 257/E27.129
(58) Field of Classification Search .......... None
See application file for complete search history.

(56) References Cited

U.S. PATENT DOCUMENTS 5,448,097 A    9/1995   Mizushima et al.
5,525,828 A    6/1996   Bassous et al.
5,886,374 A *  3/1999   Sakamoto et al. ........... 257/292
5,998,292 A   12/1999   Black et al.
6,027,956 A *  2/2000   Irissou ........................ 438/68
6,426,991 B1   7/2002   Mattson et al.
6,762,473 B1   7/2004   Goushcha et al.
6,943,409 B1   9/2005   Cheng et al.
2007/0215968 A1 9/2007  Wilson et al.

FOREIGN PATENT DOCUMENTS

WO      2005001941 A2    1/2005
WO      2005031880 A1    4/2005

* cited by examiner

*Primary Examiner*—W. David Coleman
*Assistant Examiner*—Shaka Scarlett
(74) *Attorney, Agent, or Firm*—Panitch Schwarze Belisario & Nadel LLP

(57) ABSTRACT

A photodiode includes a semiconductor having front and backside surfaces and first and second active layers of opposite conductivity, separated by an intrinsic layer. A plurality of isolation trenches filled with conductive material extend into the first active layer, dividing the photodiode into a plurality of cells and forming a central trench region in electrical communication with the first active layer beneath each of the cells. Sidewall active diffusion regions extend the trench depth along each sidewall and are formed by doping at least a portion of the sidewalls with a dopant of first conductivity. A first contact electrically communicates with the first active layer beneath each of the cells via the central trench region. A plurality of second contacts each electrically communicate with the second active layer of one of the plurality of cells. The first and second contacts are formed on the front surface of the photodiode.

8 Claims, 6 Drawing Sheets

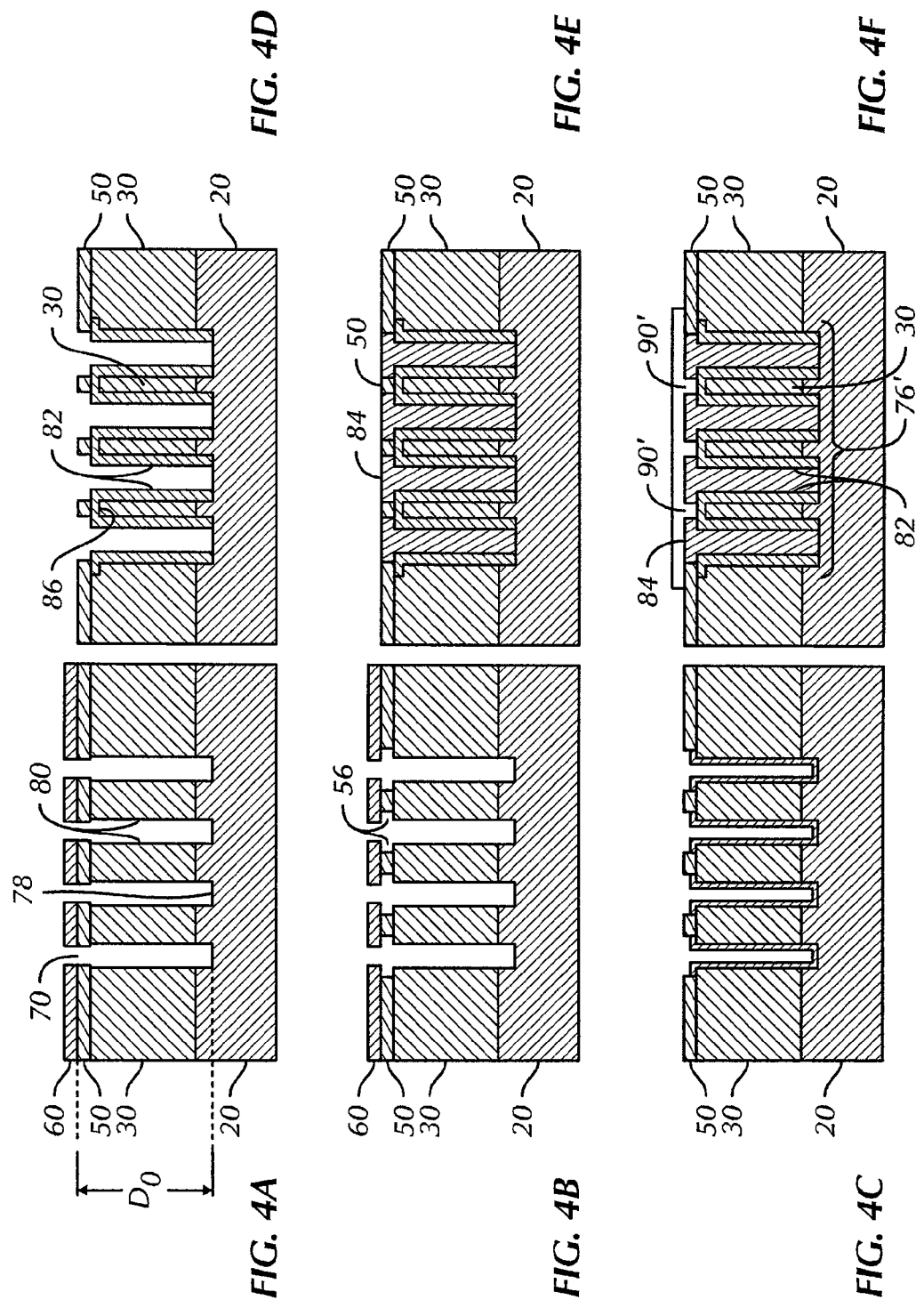

FRONT SIDE ELECTRICAL CONTACT FOR PHOTODETECTOR ARRAY AND METHOD OF MAKING SAME

CROSS REFERENCE TO RELATED APPLICATIONS

This application is a divisional application of U.S. patent application Ser. No. 11/681,543, filed Mar. 2, 2007, entitled "Front Side Electrical Contact for Photodetector Array and Method of Making Same," currently pending, which claims priority to U.S. Provisional Patent Application No. 60/778,481, filed Mar. 2, 2006, entitled "Front Side Electrical Contact for Photodetector Array and Method of Making Same."

BACKGROUND OF THE INVENTION

Embodiments of the present invention relate to a positive-intrinsic-negative (PIN) or negative-intrinsic-positive (NIP) photodiode array and a method for manufacturing a PIN/NIP photodiode array.

Positive-intrinsic-negative (PIN) photodiodes (or "PIN diodes") are known in the art. A PIN photodiode includes a lightly doped intrinsic region sandwiched between more heavily p-doped and n-doped semiconducting regions which function as anode and cathode, respectively. A sensor surface of the PIN photodiode is typically coated with an oxide or nitride passivation layer. The PIN diode's name derives from the order of the layering of the positive, intrinsic, and negative (P-I-N) materials.

Broadly speaking, a photodiode is a semiconductor device that converts light to electrical current. A PIN diode typically exhibits an increase in its electrical conductivity as a function of the intensity, wavelength, and modulation rate of the incident radiation.

BRIEF SUMMARY OF THE INVENTION

Briefly stated, an embodiment of the present invention comprises a photodiode that includes a semiconductor having a front surface and a backside surface. The semiconductor includes a first active layer having a first conductivity, a second active layer having a second conductivity opposite the first conductivity, and an intrinsic layer separating the first and second active layers. The photodiode also includes a plurality of isolation trenches having a depth extending through the second active layer and the intrinsic layer into the first active layer. The isolation trenches are arranged to divide the photodiode into a plurality of cells and to form a central trench region in active diffusion regions extend the isolation trench depth along each isolation trench sidewall and are formed by doping at least a portion of sidewalls of the isolation trenches with a dopant of the first conductivity. A conductive material fills the isolation trenches. A first electrical contact is in electrical communication with the first active layer beneath each of the plurality of cells via the central trench region. A plurality of second electrical contacts are each in electrical communication with the second active layer of one of the plurality of cells. The first electrical contact and the plurality of second electrical contacts are formed on the front surface of the photodiode.

Another embodiment of the present invention comprises a method of manufacturing a photodiode that includes the step of providing a semiconductor having a front surface and a backside surface. The semiconductor includes a first active layer having a first conductivity, a second active layer having a second conductivity opposite the first conductivity, and an intrinsic layer separating the first and second active layers. The method further includes the step of forming a plurality of isolation trenches having a depth extending through the second active layer and the intrinsic layer into the first active layer. The isolation trenches are arranged to divide the photodiode into a plurality of cells and to form a central trench region in electrical communication with the first active layer beneath each of the plurality of cells. The method also includes the steps of doping at least a portion of sidewalls of the isolation trenches with a dopant of the first conductivity to form a sidewall active diffusion region extending the isolation trench depth along each isolation trench sidewall, filling the isolation trenches with a conductive material, forming a first electrical contact in electrical communication with the first active layer beneath each of the plurality of cells via the central trench region, and forming a plurality of second electrical contacts each in electrical communication with the second active layer of one of the plurality of cells. The first electrical contact and the plurality of second electrical contacts are formed on the front surface of the photodiode.

Still another embodiment of the present invention comprises a method of forming an electrical contact between at least two electrical elements of a silicon on insulator (SOI) semiconductor that includes the steps of providing a silicon-on-insulator semiconductor having a first region of a first conductivity and a second region of a second conductivity, forming at least one trench extending through the first region into the second region, doping sidewalls of the at least one trench with a dopant of the second conductivity to form a sidewall active diffusion region along each isolation trench sidewall, filling the at least one trench with a conductive material, and forming a first electrical contact in electrical communication with the first region via the at least one trench and sidewall active diffusion region.

BRIEF DESCRIPTION OF THE SEVERAL VIEWS OF THE DRAWINGS

The following detailed description of the preferred embodiments of the present invention will be better understood when read in conjunction with the appended drawings. For the purpose of illustrating the invention, there are shown in the drawings embodiments which are presently preferred. It is understood, however, that the invention is not limited to the precise arrangements and instrumentalities shown. In the drawings:

FIGS. 4A-4F are a series of partial side cross-sectional views, omitting a second active layer, omitting peripheral isolation trenches, and showing the photodiode of FIG. 3 in various stages in a manufacturing process;

DETAILED DESCRIPTION OF THE INVENTION

Figure 1:
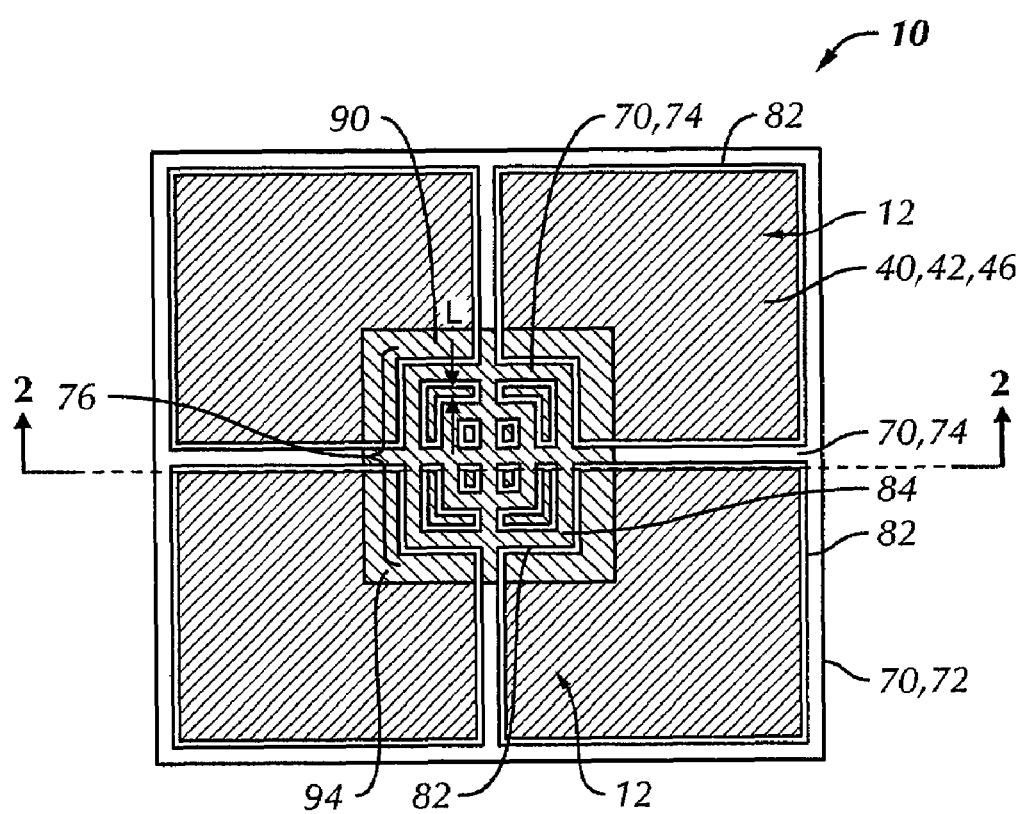
FIG. 1 is a top plan view of a photodiode in accordance with a first preferred embodiment of the present invention, shown with an oxide layer omitted, and showing a first electrical contact translucent, to illustrate a central trench region beneath the first electrical contact.

Certain terminology is used in the following description for convenience only and is not limiting. The words "right", "left", "lower", and "upper" designate directions in the drawings to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, the words "a" and "an" as used in the claims and in the corresponding portion of the specification, mean "at least one."

As used herein, reference to conductivity will reflect the embodiment illustrated and described. However, those skilled in the art know that p-type conductivity can be switched with n-type conductivity and the device would still be functionally correct. Therefore, where used herein, the artisan will recognize that p-type conductivity could be substituted where reference is made to n-type conductivity, and vice versa.

Figure 2:
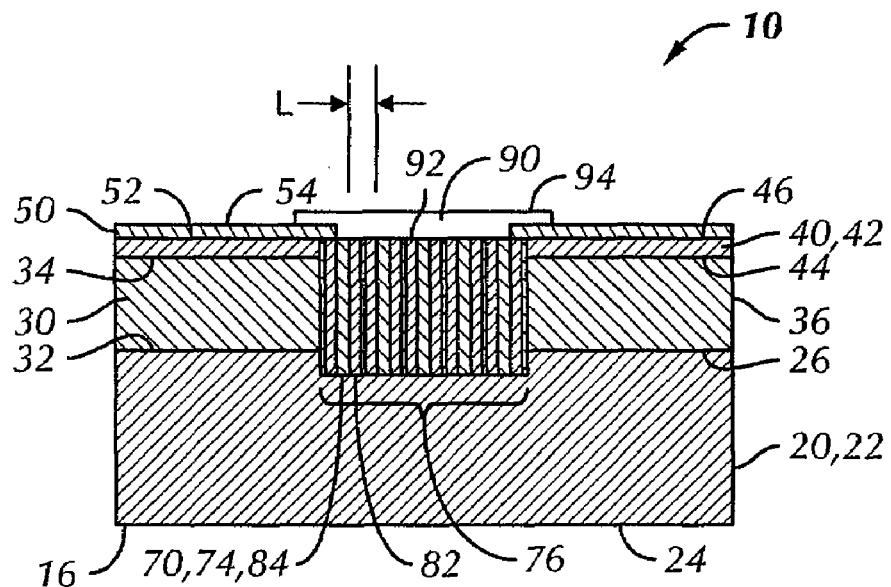
FIG. 2 is a partial side cross-sectional view of the photodiode of FIG. 1, taken along line 2-2 of FIG. 1, omitting peripheral isolation trenches, and showing a first arrangement of the central trench region.

Referring to the drawings in detail, wherein like reference numerals indicate like elements throughout, there is shown in FIGS. 1-2 a positive-intrinsic-negative (PIN) photodiode 10 in accordance with a first preferred embodiment of the present invention. The PIN photodiode 10 is preferably separated into a plurality of individual cells 12. Four cells 12 are illustrated in FIG. 1, but a greater or lesser number of cells 12 is possible. The photodiode 10 is a semiconductor having a light-sensitive front surface 14 and a backside surface 16. The photodiode 10 includes a semiconductor substrate 20 forming a first active layer 22. The first active layer 22 has a backside surface 24 and a top surface 26. The first active layer 22 is heavily doped with a dopant having a first conductivity. The first conductivity is preferably n-type, and the first active layer 22 preferably forms a cathode. Alternatively, the first conductivity could be p-type, and the first active layer 22 could form an anode. Preferably, the substrate 20 is formed of silicon (Si), but alternatively could be formed of other materials such as gallium arsenide (GaAs), germanium (Ge) and other suitable materials well-known in the art of semiconductor manufacture.

A second semiconductor layer 30 having a backside surface 32 adjacent the first active layer top surface 26 and a top surface 34 forms an intrinsic layer 36. Preferably, the intrinsic layer 36 is lightly doped with a n-type dopant. Alternatively, the intrinsic layer 36 could be formed from a semiconductor material containing substantially no impurities. Accordingly, the term "intrinsic" should not be construed as limiting and the intrinsic layer 36 of the present invention can embrace both pure and doped semiconductor substrates formed of various conventional materials known in the art of semiconductor manufacture.

The photodiode 10 further includes a third semiconductor layer 40 forming a second active layer 42 having a second conductivity opposite the first conductivity of the first active layer 30. The second active layer 42 has a backside surface 44 adjacent the intrinsic layer top surface 34. The second active layer 42 has a top surface 46. The second conductivity is preferably p-type, and the second active layer 42 preferably forms an anode. Alternatively, the second conductivity could be n-type, and the second active layer could form a cathode. The intrinsic layer 36 separates the first and second active layers 22, 42.

Preferably, an oxide layer 50 is formed on the second active layer top surface 46. The oxide layer 50 has a backside surface 52 adjacent the second active layer top surface 46 and a top surface 54. The oxide layer 50, if provided, forms a dielectric interference reflector which improves the light absorption efficiency of the photodiode 10.

A plurality of isolation trenches 70 are formed and function at least in part to separate the photodiode 10 into the plurality (four illustrated) of cells 12. As is known in the art of semiconductor manufacturing, the trenches 70 reduce electrical crosstalk between the cells 12. The trenches 70 are preferably of a depth $D_o$, extending through the oxide layer 50 (if provided), the second active layer 42, the intrinsic layer 36, and at least partially into the first active layer 22. Both peripheral trenches 72 and interior trenches 74 are preferably provided. The peripheral trenches 72 extend about at least a portion of an outer periphery of the photodiode 10. The interior isolation trenches 74 are arranged generally within the interior to divide the photodiode 10 into the cells 12, electrically isolating each of the cells 12 from one another. The interior isolation trenches 74 are further arranged to form a central trench region 76 in electrical communication with the first active layer 22 of each of the plurality of cells 12. More particularly, in the embodiment illustrated, the central trench region 76 is formed by the intersection of two medial interior trenches 74, each extending from one side of the photodiode 10 to an opposing side. The central trench region 76 further includes two concentric substantially square (when viewed in the top plan view of FIG. 1) medial trench patterns, each centered about the intersection of the two medial interior trenches 74. Each trench 70 includes a trench bottom 78 preferably positioned at depth $D_o$ from the photodiode top surface 14 and trench sidewalls 80. As discussed further below, the trench sidewalls 80 are doped with a dopant of the first conductivity to form sidewall active diffusion regions 82 extending the isolation trench depth along each isolation trench sidewall 80. The isolation trenches 70 are preferably filled with a conductive material 84, such as doped or undoped polysilicon.

The isolation trenches 70 in the central trench region 76 are arranged with a lateral spacing L (see FIGS. 1 and 2) between sidewalls 80 of adjacent trenches 70. In the embodiment illustrated in FIGS. 1 and 2, the lateral spacing L is no more than twice a lateral depth $L_D$ (see FIG. 3) of the sidewall active diffusion regions 82. Therefore, the sidewall active diffusion regions 82 extend at least substantially continuously laterally between adjacent trenches 70 in the central trench region 76.

A first electrical contact 90 is formed on top of the central trench region 76, on the photodiode front surface 14, and is in electrical communication with the first active layer 22 beneath each of the plurality of cells 12. As the first electrical contact 90 is in electrical contact with the preferably cathodic first active layer 22, the first electrical contact 90 is preferably a cathode. A plurality of second electrical contacts (not illustrated) are also formed on the photodiode front surface 14. Each of the plurality of second electrical contacts is in electrical communication with the second active layer 42 of one of the cells 12. As the second electrical contacts (not illustrated) are in contact with the preferably anodic second active layer 42, the second electrical contacts are preferably anodes.

Figure 3:
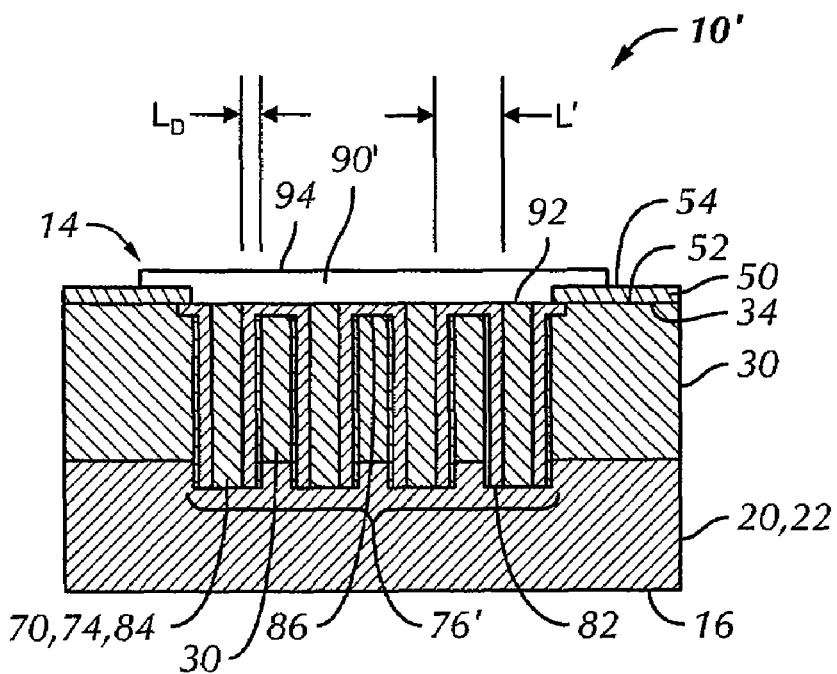
FIG. 3 is a partial side cross-sectional view of a photodiode in accordance with a second preferred embodiment of the present invention, omitting a second active layer, omitting peripheral isolation trenches, and showing a second embodiment arrangement of the central trench region.
Figure 5A:
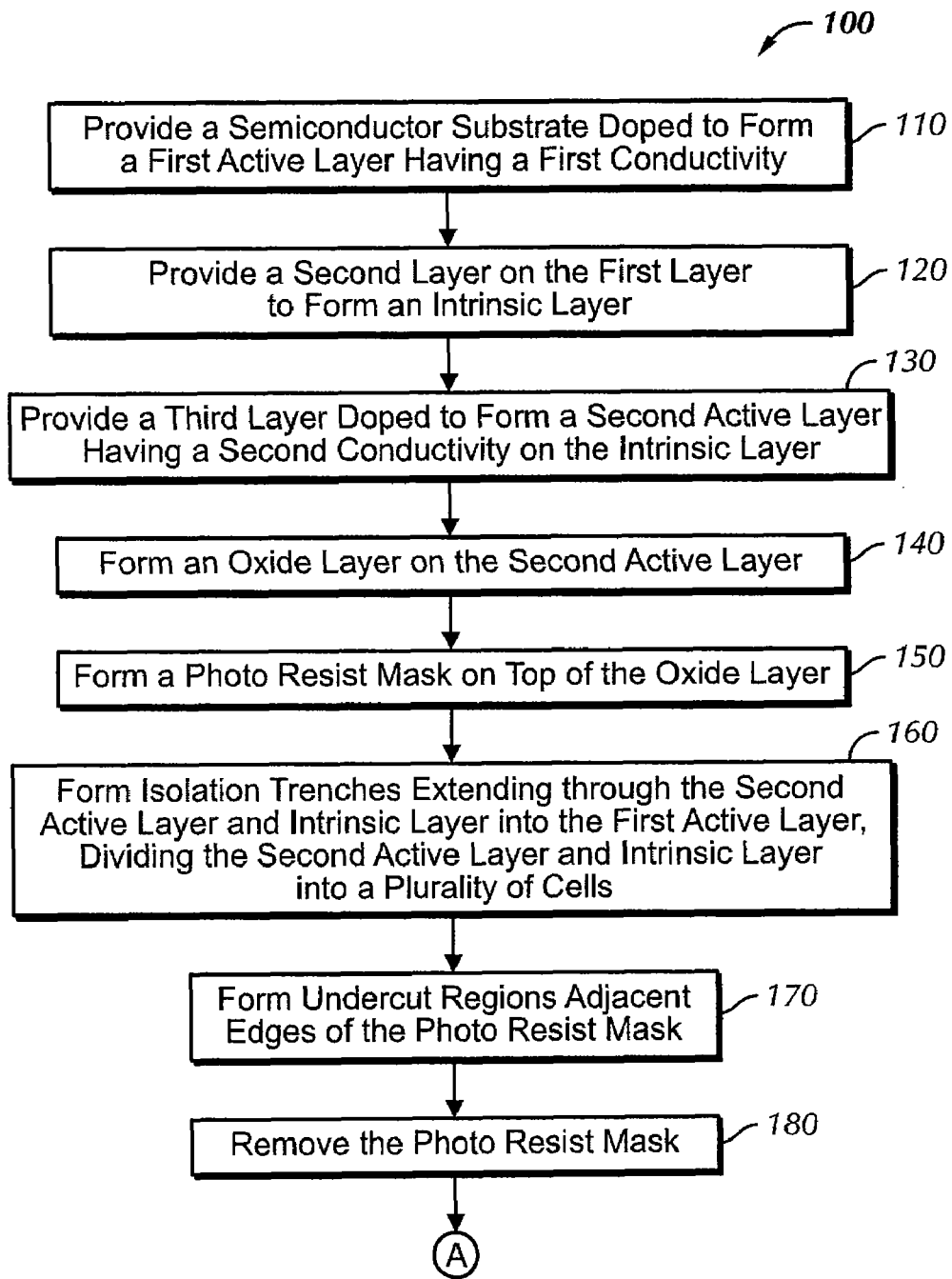
FIGS. 5A and 5B are a flow diagram of steps of a manufacturing process for producing the photodiodes of FIGS. 1 and 3.
Figure 5B:
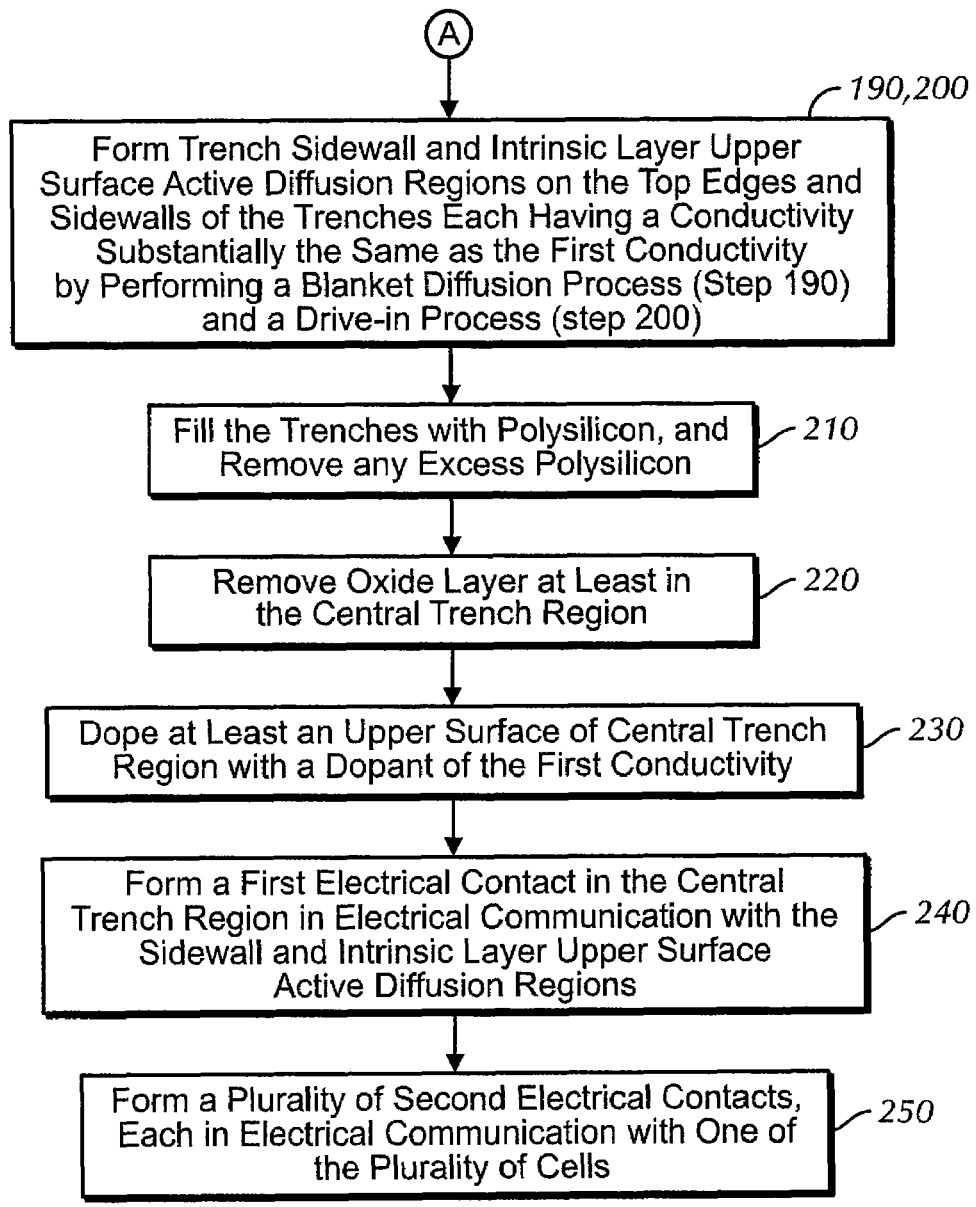

With reference now to FIG. 3, in a second embodiment photodiode 10', lateral spacing L' between adjacent trenches 70 in central trench region 76' is increased from the lateral spacing L of the first embodiment photodiode 10. The second embodiment lateral spacing L' is greater than twice the lateral depth $L_D$ of each adjacent sidewall active diffusion region 82. Thus the adjacent sidewall active diffusion regions 82 extend only partially between adjacent trenches 70 in the second embodiment central trench region 76'. With a larger footprint or top view cross-sectional area of the second embodiment central trench region 76', the length and width of a second embodiment first electrical contact 90' is increased commensurately. Operation and structure of the second embodiment photodiode 10' is otherwise substantially the same as or similar to the structure and operation of the first embodiment photodiode 10.

With continued reference to FIG. 3, with the second embodiment lateral spacing L' increased such that the sidewall active diffusion regions 82 extend only partially between adjacent isolation trenches 70, at least a portion of the intrinsic layer top surface 34 may be doped with a dopant of the first conductivity to form at least one and preferably, as illustrated, a plurality of intrinsic layer upper surface active diffusion regions 86. The intrinsic layer upper surface active diffusion regions 86 thus form an electrical contact on the intrinsic layer top surface 34 to the trench sidewall active diffusion regions 82.

With reference now to FIGS. 4A-4F and 5A-5B, a method of manufacturing 100 is used to produce the first and second embodiment photodiodes 10 and 10'. Steps of the method 100 are designated as "first", "second", etc. for convenience only, and such nomenclature is not necessarily indicative of the order in which the steps are performed. The method 100 comprises a first step 110 of providing semiconductor substrate 20 doped to form the first active layer 22 having a first conductivity. In a second step 120, second layer 30 forming intrinsic layer 36 is formed on the first active layer 22. In a third step 130, third layer 40 forming second active layer 42 having a second conductivity opposite the first conductivity is formed on the intrinsic layer 36. In a fourth step 140, an oxide layer 50 is formed on the second active layer 42. In a fifth step 150, a photoresist mask is formed on the oxide layer 50. First through fifth steps 110 through 150 are conventional and need not be described in further detail.

In a sixth step 160, the plurality of isolation trenches 70 are formed, with each trench 70 having depth $D_o$ and extending through the second active layer 42 and the intrinsic layer 36 and at least partially into the first active layer 22. The isolation trenches 70 are arranged to divide the photodiode 10 or 10' into the plurality of cells 12. The isolation trenches 70 are further arranged to form the central trench region 76 in electrical communication with the first active layer 22 beneath each of the plurality of cells 12.

Preferably, the trenches 70 are formed by a conventional semiconductor manufacturing process such as plasma etching, Reactive Ion Etching (RIE), or chemical etching. The trench sidewalls 80 may be smoothed, if needed, using conventional processes such as plasma etching or wet etching. FIG. 4A is representative of the work-in-process photodiode 10 or 10' upon completion of first through sixth steps 110 through 160, noting however that the second active layer 42 of the third step 130 has been omitted from FIG. 4A.

In a preferred seventh step 170, the oxide layer 50 adjacent upper edges of the trenches 70 is etched to form undercut regions 56. A conventional photoresist mask 60 may be used for protection of the portions of the oxide layer 50 which are not to be etched. The undercut regions 56 are preferably formed using a wet etch process. As discussed below, provision of the undercut regions 56 facilitates formation of the intrinsic layer upper surface active diffusion regions 86. FIG. 4B is representative of the work-in-process photodiode 10 or 10' upon completion of first through seventh steps 110 through 170.

In an eighth step 180, the photoresist mask 60 is removed using conventional techniques well-known in the art of semiconductor manufacturing, leaving the oxide layer 50 to form an oxide mask that is not present in either the trenches 70, or adjacent the top edges of the trenches. In ninth and tenth steps 190 and 200, the trench sidewalls 80 and intrinsic layer upper surface active diffusion regions 82, 86, respectively, are formed. In ninth step 190, a blanket diffusion process applies dopant of the first conductivity to the trench sidewalls 80 and to the intrinsic layer upper surfaces adjacent the trench sidewalls. In tenth step 200, the deposition from step 190 is driven in, to create the active diffusion regions 82 and 86. FIG. 4C is representative of the work-in-process photodiode 10 or 10' upon completion of first through ninth steps 110-190. FIG. 4D is representative of the work-in-process photodiode 10 or 10' upon completion of first through tenth steps 110-200.

The doping process of steps 190, 200 may be performed using convention techniques such as ion implantation, solid diffusion, liquid diffusion, spin-on deposits, plasma doping, vapor phase doping, laser doping or the like. Doping with boron B results in a more p-type region, doping with phosphorus results in a more n-type region and doping with arsenic Ar results in a more n-type region. Other dopants may be utilized such as antimony Sb, bismuth Bi, aluminum Al, indium In, gallium Ga and the like depending on the material of the intrinsic layer 36 and the desired strength of the doping.

In an eleventh step 210, the isolation trenches 70 are filled with a conductive material such as polysilicon. The polysilicon 84 may be doped or undoped. Any excess polysilicon is removed, preferably using a conventional chemical mechanical polishing (CMP) process. FIG. 4E is representative of the work-in-process photodiode 10 or 10' upon completion of first through eleventh steps 110-210.

In a twelfth step 220, portions of the oxide layer 50 at least in the central trench region 76 are removed to expose portions of the upper surface of the intrinsic layer 36. Then, in a thirteenth step 230, a dopant diffusion process is preferably applied to the upper surface of the central trench region 76 to provide good ohmic contact between the first electrical contact 90 and the polysilicon 84. In a fourteenth step 240, the first electrical contact 90 is formed on the top surface of the central trench region 76. The first electrical contact 90 is thus in electrical communication with the sidewall and intrinsic layer upper surface active diffusion regions 82 and 86, respectively. FIG. 4F is representative of the work-in-process photodiode 10 or 10' upon completion of first through fourteenth steps 110-240. In a fifteenth step 250, the plurality of second electrical contacts (not illustrated) are formed, each in electrical communication with the second active layer 42 of each cell 12.

The first electrical contact 90 and plurality of second electrical contacts (not illustrated) are formed using conventional techniques known in the art of semiconductor manufacturing, such as sputtering, evaporation and/or electroplating. The electrical contacts may be formed from conventional materials used to form electrical contacts such as aluminum, aluminum silicon, copper, gold, silver, titanium, tungsten, nickel, or doped or undoped polysilicon.

Figure 6:
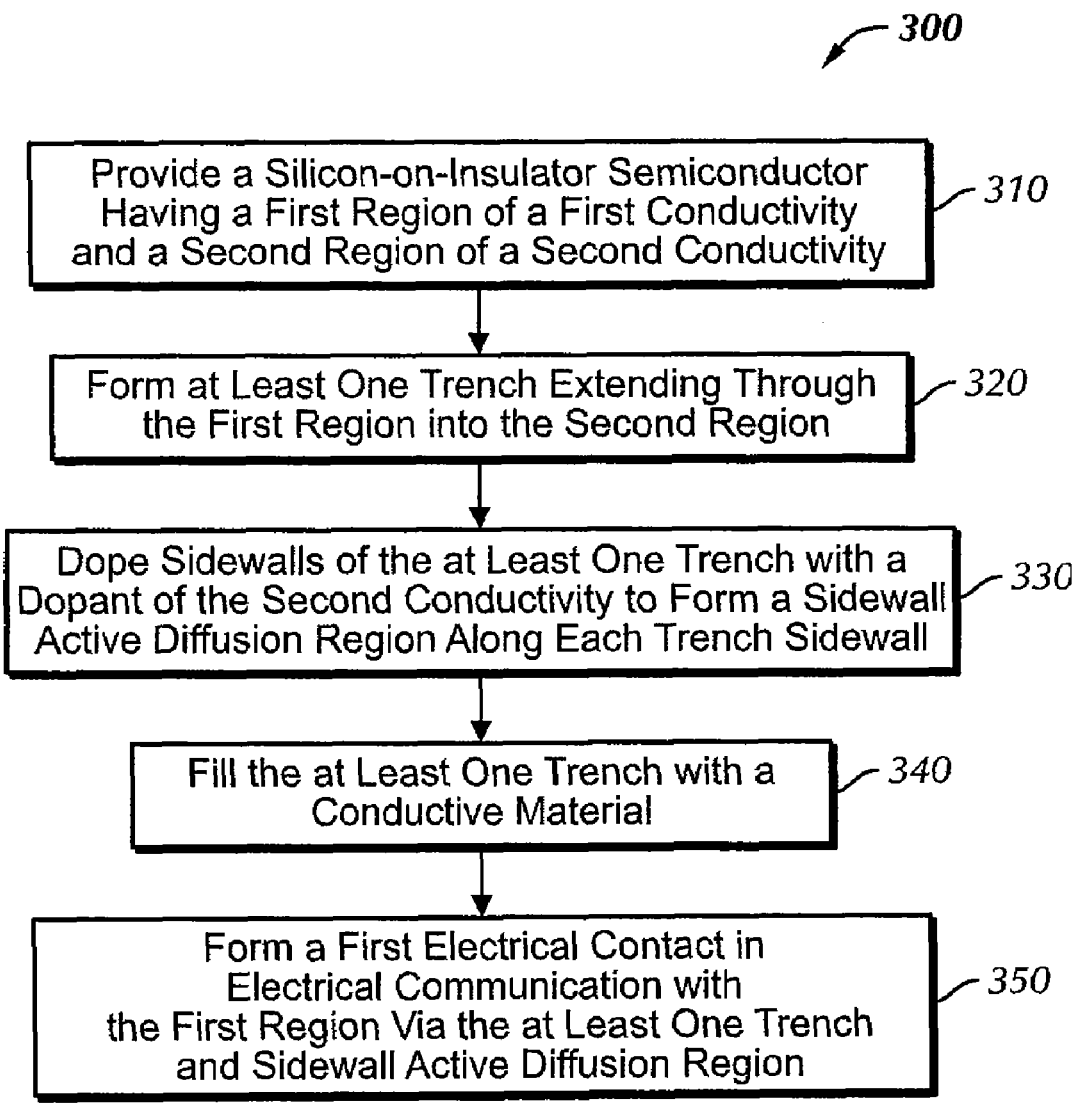
FIG. 6 is a flow diagram of a method of forming an electrical contact between at least two electrical elements of a silicon on insulator (SOI) semiconductor.

The method 100 can be modified to be useful as a method of forming an electrical contact between at least two electrical elements of a silicon on insulator (SOI) semiconductor. With reference to FIG. 6, the SOI method 300 comprising a first (as before, sequential identifiers of the steps of method 300 do not necessarily reflect the order in which the steps must be carried out) step 310 of providing a silicon-on-insulator semiconductor having a first region of a first conductivity and a second region of a second conductivity. In a second step 320, at least one trench extending through the first region into the second region is formed. In a third step 330, sidewalls of the at least one trench are doped with a dopant of the second conductivity to form a sidewall active diffusion region along each isolation trench sidewall. In a fourth step 340, the at least one trench is filled with a conductive material, such as doped or undoped polysilicon. In a fifth step 350, a first electrical contact in electrical communication with the first region via the at least one trench and sidewall active diffusion region is formed.

From the foregoing, it can be seen that embodiments of the present invention are directed to a photodiode having a first electrical contact and a plurality of second electrical contacts formed on a light-sensitive front surface. Embodiments of the present invention are further directed to a method of manufacturing such a photodiode. It will be appreciated by those skilled in the art that changes could be made to the embodiments described above without departing from the broad inventive concept thereof. It is understood, therefore, that the invention is not limited to the particular embodiments disclosed, but is intended to cover modifications within the spirit and scope of the present application.

We claim:

1. A method of manufacturing a photodiode, the method comprising:
    providing a semiconductor having a front surface and a backside surface and including:
        a first active layer having a first conductivity,
        a second active layer having a second conductivity opposite the first conductivity, and
        an intrinsic layer separating the first and second active layers;
    forming a plurality of isolation trenches having a depth extending through the second active layer and the intrinsic layer into the first active layer, the isolation trenches being arranged to divide the photodiode into a plurality of cells, and the isolation trenches being arranged to form a central trench region in electrical communication with the first active layer beneath each of the plurality of cells;
    doping at least a portion of sidewalls of the isolation trenches with a dopant of the first conductivity to form a sidewall active diffusion region extending the isolation trench depth along each isolation trench sidewall;
    filling the isolation trenches with a conductive material;
    forming a first electrical contact in electrical communication with the first active layer beneath each of the plurality of cells via the central trench region; and
    forming a plurality of second electrical contacts each in electrical communication with the second active layer of one of the plurality of cells, the first electrical contact and the plurality of second electrical contacts being formed on the front surface of the photodiode.

2. The method of manufacturing a photodiode of claim 1, wherein at least a portion of an upper surface of the intrinsic layer is doped with a dopant of the first conductivity to form at least one intrinsic layer upper surface active diffusion region.

3. The method of manufacturing a photodiode of claim 2, wherein the doping of the intrinsic layer upper surface comprises a first step of blanket doping followed by a second step of a drive-in process.

4. The method of manufacturing a photodiode of claim 1, wherein the doping of the trench sidewalls is performed using one of ion implantation, solid diffusion, liquid diffusion, spin-on deposition, plasma doping, vapor phase doping, and laser doping.

5. The method of manufacturing a photodiode of claim 1, wherein the doping of the trench sidewalls comprises a first step of blanket doping followed by a second step of a drive-in process.

6. The method of manufacturing a photodiode of claim 1, wherein the plurality of isolation trenches are formed using one of plasma etching, Reactive Ion Etching (RIE), and chemical etching.

7. The method of manufacturing a photodiode of claim 1, the method further comprising:
    forming an oxide layer on the second active layer;
    forming a photoresist layer on the oxide layer to form an etching mask;
    etching the oxide layer beneath the photoresist mask to form undercut regions proximate edges of the photoresist mask.

8. The method of manufacturing a photodiode of claim 7, wherein the oxide layer is etched using a Reactive Ion Etching.

\* \* \* \* \*